(12) United States Patent
Yeo et al.

(10) Patent No.: US 10,121,742 B2
(45) Date of Patent: Nov. 6, 2018

(54) METHOD OF FORMING A PACKAGED SEMICONDUCTOR DEVICE USING GANGED CONDUCTIVE CONNECTIVE ASSEMBLY AND STRUCTURE

(71) Applicant: AMKOR TECHNOLOGY, INC., Tempe, AZ (US)

(72) Inventors: Siang Miang Yeo, Selangor (MY); Mohd Hasrul Bin Zulkifli, Selangor (MY)

(73) Assignee: Amkor Technology, Inc., Tempe, AZ (US)

(*) Notice: Subject to any disclaimer, the term of this patent is extended or adjusted under 35 U.S.C. 154(b) by 0 days.

(21) Appl. No.: 15/460,032

(22) Filed: Mar. 15, 2017

(65) Prior Publication Data

US 2018/0269147 A1    Sep. 20, 2018

(51) Int. Cl.
*H01L 23/495* (2006.01)
*H01L 23/528* (2006.01)
(Continued)

(52) U.S. Cl.
CPC ........ *H01L 23/528* (2013.01); *H01L 21/4821* (2013.01); *H01L 21/56* (2013.01);
(Continued)

(58) Field of Classification Search
CPC ........ H01L 2924/00; H01L 2924/0002; H01L 2924/181; H01L 23/3107; H01L 23/49548; H01L 21/4842; H01L 21/561; H01L 21/568; H01L 23/3114; H01L 23/49537; H01L 23/49541; H01L 23/49558; H01L 23/49582
USPC ........ 257/666, E21.506, E23.031, E23.046, 257/E23.054, E23.124, 676, 690; 438/112
See application file for complete search history.

(56) References Cited

U.S. PATENT DOCUMENTS 6,608,366 B1* 8/2003 Fogelson ............. H01L 21/561
                                                    257/666
2005/0269696 A1    12/2005 Ochiai
2014/0001616 A1*   1/2014 Daniels ............... H01L 24/97
                                                    257/676

OTHER PUBLICATIONS

Notice of Allowance received from Korean Patent Office forwarded by agent responsible for Korean prosecution; in Korean, English translation not available; dated Nov. 30, 2016; 5 pages.

* cited by examiner

*Primary Examiner* — Edward Chin
(74) *Attorney, Agent, or Firm* — Kevin B. Jackson

(57) ABSTRACT

A method for forming packaged semiconductor devices comprises providing a first conductive frame structure. The method includes coupling a second conductive frame structure to the first conductive frame structure to provide a first sub-assembly, wherein the second conductive frame structure comprises a plurality of interconnected conductive connective structures. The method includes encapsulating the first sub-assembly with an encapsulating layer to provide an encapsulated sub-assembly. The method includes removing joined conductive portions of the first conductive frame structure to form a plurality of conductive flank surfaces disposed on side surfaces of the encapsulated sub-assembly. The method includes forming a conductive layer on the conductive flank surfaces. The method includes separating the encapsulated sub-assembly to provide the packaged semiconductor devices each having portions of the conductive flank surfaces covered by the conductive layer.

20 Claims, 6 Drawing Sheets

(51) Int. Cl.
*H01L 23/31* (2006.01)
*H01L 21/56* (2006.01)
*H01L 21/48* (2006.01)

(52) U.S. Cl.
CPC .... *H01L 23/3114* (2013.01); *H01L 23/49503* (2013.01); *H01L 23/49541* (2013.01)

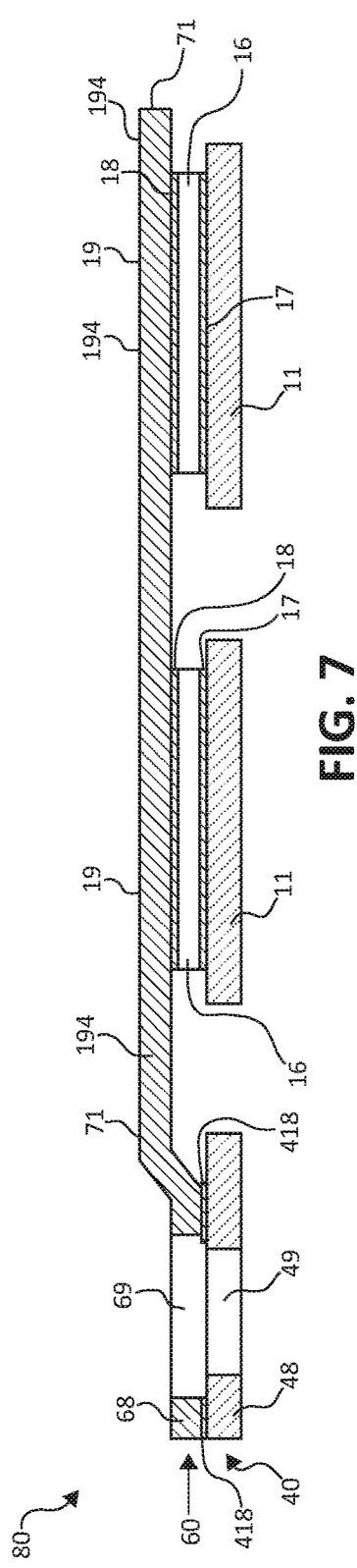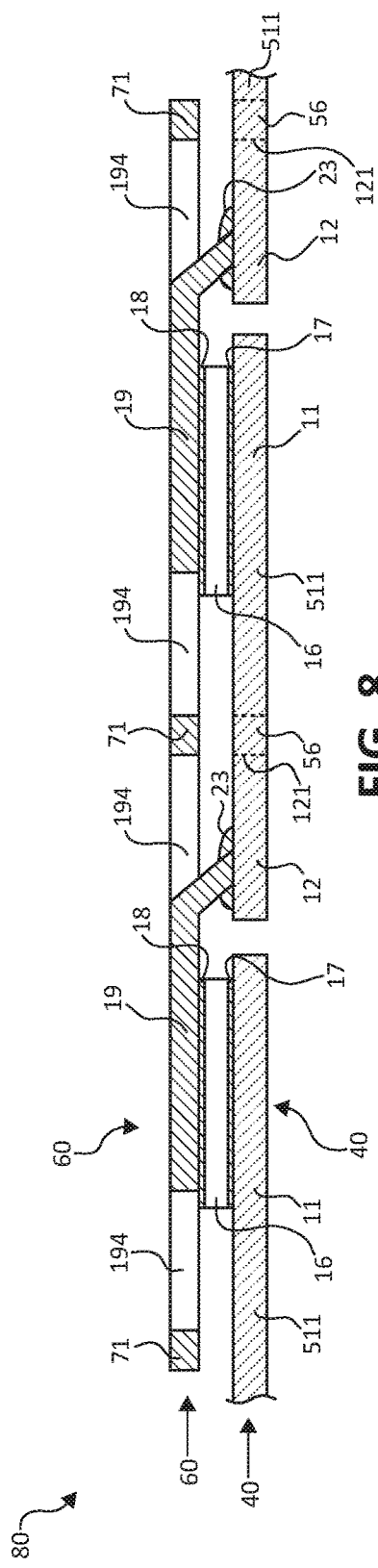

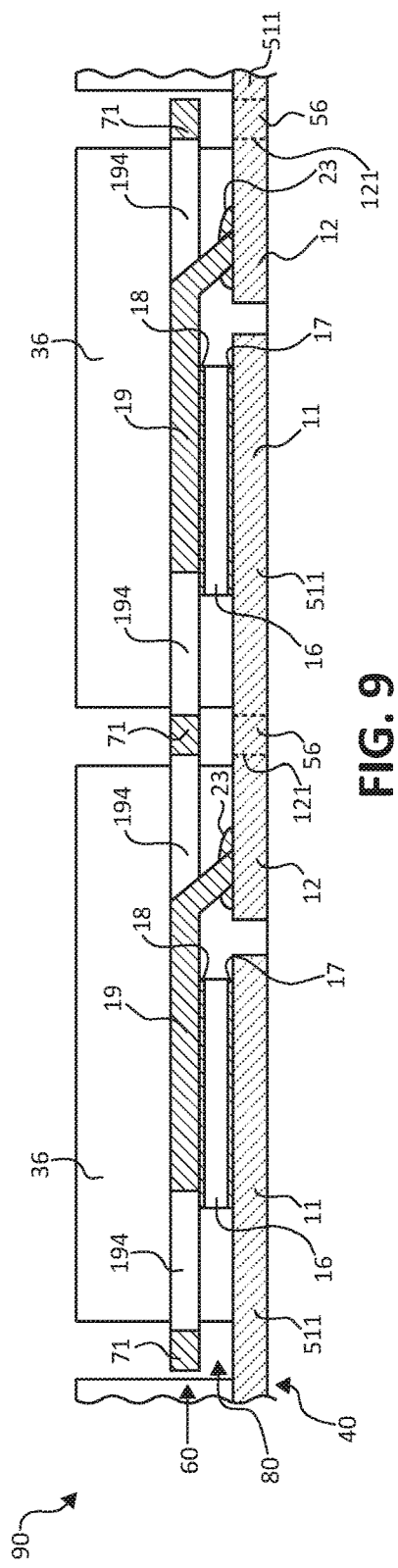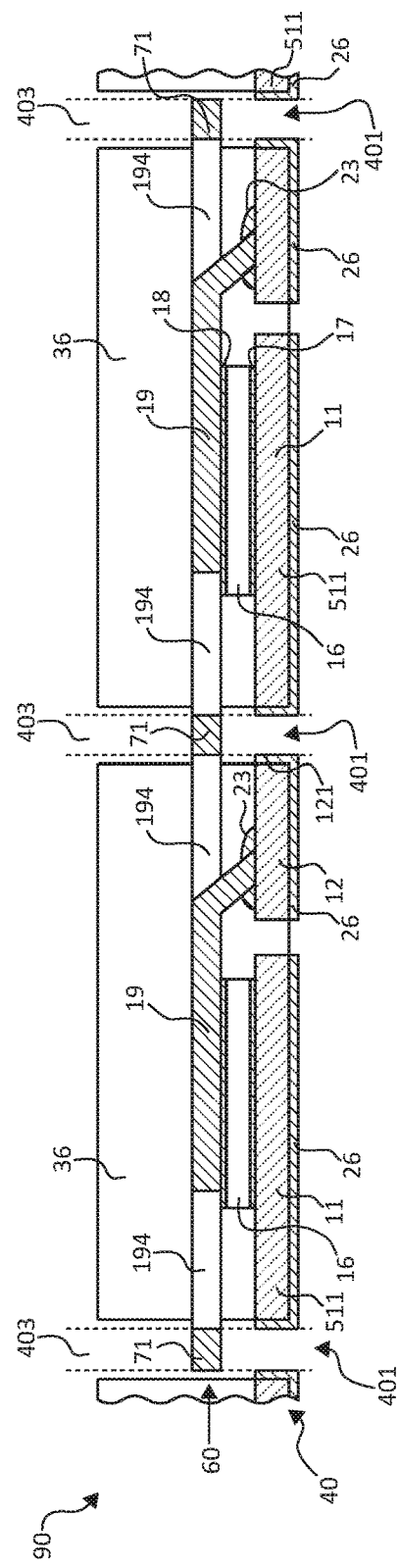

METHOD OF FORMING A PACKAGED SEMICONDUCTOR DEVICE USING GANGED CONDUCTIVE CONNECTIVE ASSEMBLY AND STRUCTURE

CROSS-REFERENCE TO RELATED APPLICATIONS

Not Applicable.

BACKGROUND OF THE DISCLOSURE

The present invention relates, in general, to electronics, and more particularly, to semiconductor packages, structures thereof, and methods of forming semiconductor packages.

In the past, packaged power semiconductor devices utilized various manufacturing techniques to deposit conductive materials on exposed portions of conductive lead frames. In discrete power semiconductor devices, such as discrete field effect transistor (FET) semiconductor devices or diode semiconductor devices, manufacturers have utilized matrix lead frames that typically include an array of die attach pads each with a plurality of leads disposed proximate to but isolated from the die attach pads. Semiconductor die were attached to the die attach pads and electrically connected to the leads using discrete, stand-alone, or separated connective structures, such as wirebond interconnects or clips. This sub-assembly was then encapsulated to provide molded package bodies for each semiconductor die. Next, the encapsulated sub-assembly was placed in an electroplating apparatus and conductive material plated onto exposed surfaces of the conductive lead frames. During the electroplating process, current is passed through conductive leads, which reduces dissolved metal cations to form a thin coherent metal coating on exposed surfaces of the conductive lead frame.

One problem with this past approach is that in order for current to pass through the entire conductive lead frame, certain leads from adjoining sections of the lead frame must be joined together. After the electroplating process, the individually packaged semiconductor devices are then separated using a saw process. The saw process separates the joined leads thereby providing lead faces or flank surfaces without electroplated material. This leaves unwanted exposed lead frame material, which is typically copper. The exposed copper does not wet with solder, which produces weaker solder joints and detrimentally affects the reliability of assembled electronic components.

In attempt to address this problem, manufacturers have punched holes in the joined leads, created half-etched regions in the joined leads, or used side grooves in the joined leads to provide some side surface or flank surface coverage of the plated material. Although these approaches produced lead faces with between about 20% and 60% wettable surface coverage for these side or flank surfaces, these approaches cannot provide up to 100% coverage, and thus have still produced inferior solder joints. Also, these approaches have not provided strong enough solder joint protection at the assembly board level as required to fulfill stringent automotive specifications, which require 100% wettable flank coverage.

Accordingly, it is desirable to have a method and a structure that provides a packaged semiconductor device that improves the wettable surface coverage for side or flank surfaces of the lead frame. It is also desirable for the structure and method to be easily incorporated into manufacturing flows, and to be cost effective.

BRIEF SUMMARY

The present description includes, among other features, a method of manufacturing a packaged semiconductor using a conductive frame structure having a plurality (i.e., at least two) conductive connective structures ganged together. The ganged conductive connective structure is used to pass current to conductive components on another conductive frame structure having exposed conductive flank surfaces to facilitate improved coverage of the exposed conductive flank surfaces with solderable material. The method and resulting structure provide, among other things, a packaged semiconductor device configured to provide up to a 100% wettable flank surfaces. That is, the method and structure provide exposed side or conductive flank surfaces substantially covered with solderable material that facilitates an improved wettable surface for attaching to a next level of assembly, such as a printed circuit board. The method and structure provide for improved reliability by facilitating stronger solder joints compared to previous approaches. The method and structure are suitable for packaged semiconductor devices and other electronic devices having exposed flank or side surfaces configured for subsequent deposition of solderable materials, including, but not limited to, power semiconductor devices having flank surfaces on two opposing sides of the packaged semiconductor device.

More particularly, in one embodiment, a method for forming packaged semiconductor devices comprises providing a first conductive frame structure. The method includes coupling a second conductive frame structure to the first conductive frame structure to provide a first sub-assembly, wherein the second conductive frame structure comprises a plurality of interconnected conductive connective structures. The method includes encapsulating the first sub-assembly with an encapsulating layer to provide an encapsulated sub-assembly. The method includes removing joined conductive portions of the first conductive frame structure to form a plurality of conductive flank surfaces disposed on side surfaces of the encapsulated sub-assembly. The method includes forming a conductive layer on the conductive flank surfaces. The method includes separating the encapsulated sub-assembly to provide the packaged semiconductor devices each having portions of the conductive flank surfaces covered by the conductive layer.

In another embodiment, a method of making packaged electronic devices comprises providing a first conductive frame structure, which includes a first sub-structure having a first conductive component, a second sub-structure having a second conductive component, wherein the first conductive component is adjoined to the second conductive component to provide a joined conductive structure connecting the first sub-structure to the second sub-structure, a first electronic die is coupled to the first sub-structure, and a second electronic die is coupled to the second sub-structure. The method includes providing a second conductive frame structure, which includes a first conductive connective structure, and a second conductive connective structure, wherein the first conductive connective structure is physically interconnected to the second conductive connective structure, attaching the first conductive connective structure to the first electronic die and the first conductive component and attaching the second conductive connective structure to at least the second electronic die to form a first sub-assembly. The method includes encapsulating portions of the first sub-assembly with an encapsulating layer to form an encapsulated sub-assembly, wherein at least portions of the first conductive frame structure are exposed to the outside of the encapsulated sub-assembly. The method includes removing all of the joined conductive structure to form a first conductive component exposed side surface and a second conductive component exposed side surface. The method includes forming a conductive layer on the exposed surfaces of the first conductive frame structure, on the first conductive component exposed side surface, and on the second conductive component exposed side surface. The method includes separating the encapsulated sub-assembly to provide a first packaged electronic device having the first conductive component exposed side surface covered by the conductive layer and a second packaged electronic device having the second conductive component exposed side surface covered by the conductive layer.

In a further embodiment, a packaged semiconductor device comprises a die attach pad, a plurality of leads disposed proximate to the die attach pad, each lead having a lead bottom surface and a lead end surface. A semiconductor die is connected to the die attach pad and a conductive clip is attached to the semiconductor die and the plurality of leads, wherein the conductive clip comprises at least one tie bar. A package body encapsulates the semiconductor die, the conductive clip, portions of the plurality of leads, at least a portion of the at least one tie bar portion, and at least a portion of the die pad, wherein each lead end surface is exposed on a side surface of the package body, and wherein an end surface of the at least one tie bar is exposed to the outside of the package body. A conductive layer is disposed on each lead end surface but not disposed on the end surface of the at least one tie bar.

BRIEF DESCRIPTION OF THE DRAWINGS

FIG. 7 illustrates a cross-sectional view of the sub-assembly of FIG. 6 taken along reference line 7-7;

FIG. 8 illustrates a cross-sectional view of the sub-assembly of FIG. 6 taken along reference line 8-8;

FIG. 9 illustrates a cross-sectional view of the sub-assembly of FIG. 8 after further processing in accordance with an embodiment of the present invention; and FIG. 10 illustrates a cross-sectional view of the sub-assembly of FIG. 9 after additional processing in accordance with an embodiment of the present invention.

Figure 1:
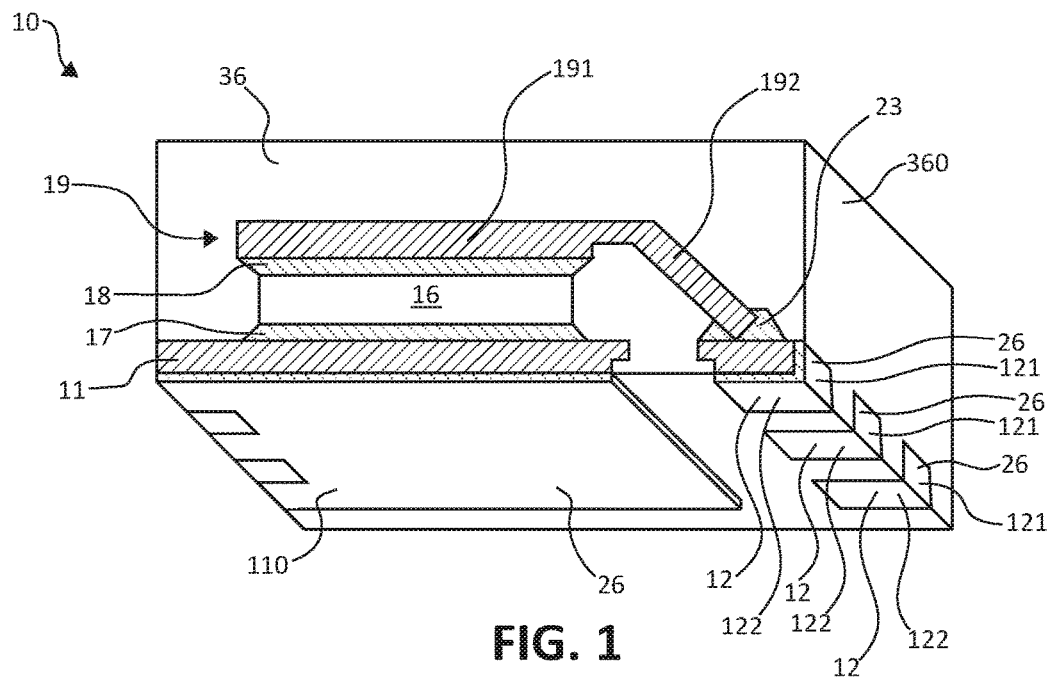
FIG. 1 illustrates a cross-sectional and partial perspective view of a packaged semiconductor device in accordance with an embodiment of the present invention, where the cross-sectional view is taken along reference line 1-1 of FIG. 3A.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

Figure 3A:
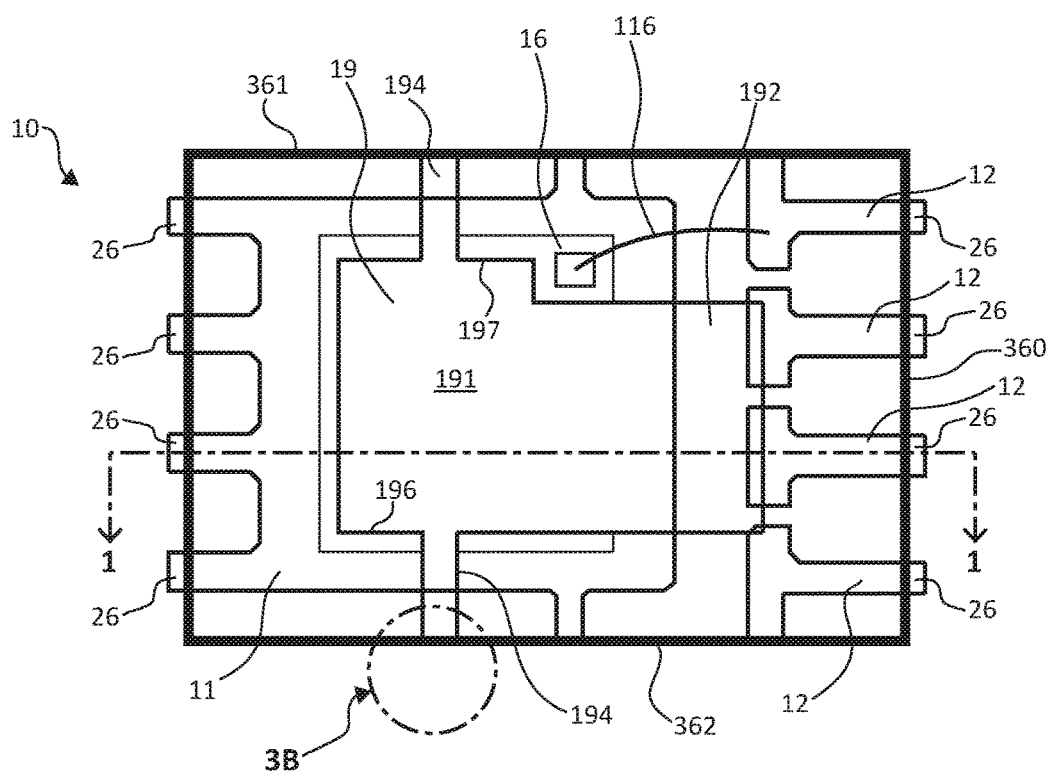
FIG. 3A illustrates a top view of the packaged semiconductor device of FIG. 1 with a portion of the package body illustrated as partially transparent.

FIG. 1 illustrates a cross-sectional and partial perspective view of a packaged electronic device 10, such as a packaged semiconductor device 10 in accordance with a first embodiment, where the cross-sectional view is taken along reference line 1-1 of FIG. 3A. In accordance with the present embodiment, packaged semiconductor device 10 includes a die attach pad 11, die pad 11, or support pad 11 and leads 12 disposed proximate to, but separated from, die attach pad 11. In one embodiment, an electronic chip 16 or electronic die 16, such as a semiconductor device 16 or semiconductor die 16 is connected or attached to die attach pad 11 using die attach material 17. In some embodiments, semiconductor device 16 is a power semiconductor device, such as a power field effect transistor (FET) structure, a diode structure, or a rectifier structure. It is understood that electronic chip 16 can be other types of electronic devices. By way of example, die attach material 17 can be a solder paste, a conductive epoxy, conductive adhesives, conductive films, non-conductive epoxy, non-conductive adhesives, non-conductive films, or other suitable attach materials as known to those of skill in the art. In some embodiments, non-conductive refers to electrically insulating and it is understood that such materials may still be thermally conductive.

Packaged semiconductor device 10 further includes a conductive connective structure 19 attached to a major surface of semiconductor device 16 and further connected to one or more leads 12. In one preferred embodiment, conductive connective structure 19 is a conductive clip style interconnect structure, which is attached to leads 12 as generally illustrated in FIG. 3A. In other embodiments, conductive connective structure 19 is attached to a single lead 12. In some embodiments, conductive connective structure 19 is mainly composed of copper, but other conductive materials can be used as well. As illustrated in FIGS. 1 and 3A, conductive connective structure 19 includes a die attach portion 191 connected to semiconductor device 16 using a die attach material 18, which can be a solder paste, a conductive epoxy, conductive adhesives, conductive films, or other suitable attach materials as known to those of skill in the art. Conductive connective structure 19 further includes a bonding portion 192, which extends outward or away from die attach portion 191 at an angle that places bonding portion 192 in an appropriate position for attaching to leads 12 using an attachment layer 23. By way of example, attachment layer 23 can be a solder paste, a conductive epoxy, conductive adhesives, conductive films, or other suitable attach materials as known to those of skill in the art. In accordance with the present embodiment, conductive connective structure 19 is configured to both provide an electrical interconnect to leads 12 for passing electrical signals to and from semiconductor device 16 in finished packaged form, and to provide an electrical interconnect for electroplating purposes while in sub-assembly form during the manufacturing of packaged semiconductor device 10.

Packaged semiconductor device 10 further includes a package body 36 that covers or encapsulates conductive connective structure 19, semiconductor die 16, at least portions of leads 12, and at least portions of die attach pad 11 while, in some embodiments, leaving lower or bottom surfaces 122 of leads 12, conductive side surfaces 121 (also referred to as conductive flank surfaces 121) of leads 12 exposed to the outside of packaged semiconductor device 10 as generally illustrated in FIG. 1. In some embodiments, package body 36 can be polymer based composite material, such as epoxy resin with filler, epoxy acrylate with filler, or polymer with proper filler. Package body 36 comprises a non-conductive and environmentally protective material that protects semiconductor die 16 from external elements and contaminants. Package body 36 may be formed using paste printing, compressive molding, transfer molding, overmolding, liquid encapsulant molding, vacuum lamination, other suitable applicator, or other processes as known to those of skill in the art. In some embodiments, package body 36 is an epoxy mold compound ("EMC") and can be formed using transfer or injection molding techniques.

In accordance with the present embodiment, conductive side surfaces 121 or conductive flank surfaces 121 are exposed through side surfaces 360 of package body 36, and further covered by a conductive layer 26, such as a solderable layer 26. By way of example, conductive layer 26 comprises tin and preferably is formed in accordance with the present embodiment using electroplating techniques. In some embodiments, conductive layer 26 is further disposed on lower surfaces 122 of leads 12 and on a bottom or lower surface 110 of die attach pad 11 as generally illustrated in FIG. 1.

As will be described in more detail later, during the manufacture of packaged semiconductor device 10 together with other packages semiconductor devices in, for example, sub-assembly form, conductive connective structure 19 is interconnected or ganged together with other conductive connective structures (for example, other conductive connective structures 19), which according to the present embodiment enables conductive layer 26 to be disposed on all of conductive flank surfaces 121 of leads 12. More particularly, the interconnected conductive connective structures 19 enable current to flow through leads 12 to facilitate the formation of conductive layer 26 during electroplating to provide increased coverage of conductive layer 26 compared to previous structures and processes. In accordance with the present embodiment, substantially all of conductive flank surfaces 121 are covered by conductive layer 26. More particularly, in some embodiments, more than 60% of each conductive flank surface 121 is covered by conductive layer 26. In some embodiments, more than about 75% of each conductive flank surface 121 is covered by conductive layer 26. In preferred embodiments, approximately 100% or substantially all of each conductive flank surface 121 is covered by conductive layer 26.

Figure 2:
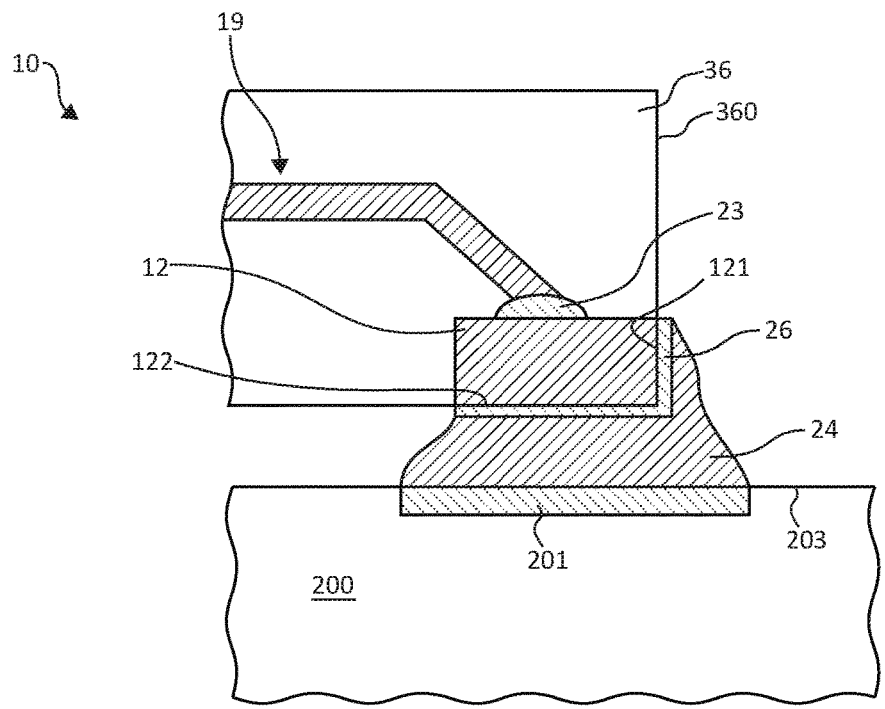
FIG. 2 illustrates a partial cross-sectional view of a portion of the packaged semiconductor device of FIG. 1.

FIG. 2 illustrates a partial cross-sectional view of a portion of packaged semiconductor device 10. With reference to FIG. 2, a portion of packaged semiconductor 10 is illustrated attached to a next level of assembly 200, such as a printed circuit board 200 having a conductive trace 201 disposed proximate to a first surface 203. In accordance with the present embodiment, conductive flank surface 121 of lead 12 is substantially covered by conductive layer 26, which facilitates approximately a 100% wettable flank for solder attach material 24. In accordance with the present embodiment, this improves the solder joint strength and the reliability of the assembled component compared to previous methods that are incapable of providing greater than 60% solderable material coverage on the flank surfaces.

FIG. 3A illustrates a top view of packaged semiconductor device 10 with a portion of package body 36 illustrated as partially transparent to view internal portions of the device. In accordance with the present embodiment, conductive connective structure 19 further includes one or more tie bars 194 extending outward from, for example, die attach portion 191 of conductive connective structure 19 to side surfaces 361 and 362 of package body 36. In one preferred embodiment, conductive connective structure 19 comprises at least two tie bars 194 on opposing sides 196 and 197 respectively of conductive connective structure 19 as generally illustrated in FIG. 3A. In one embodiment, tie bars 194 are configured to interconnect, physically connect, or gang together conductive connective structure 19 to other conductive connective structures (for example, other conductive connective structures 19) in accordance with the present embodiment. In one embodiment, a conductive connective structure 116, such as a conductive wire bond, electrically connects another pad portion on semiconductor device 16 to a lead 112 as generally illustrated in FIG. 3A.

Figure 3B:
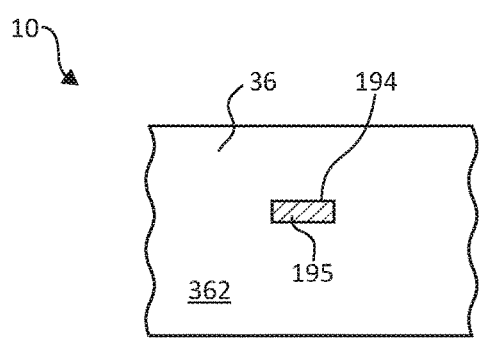
FIG. 3B illustrates an enlarged partial side view of the packaged semiconductor device of FIG. 3A.

FIG. 3B is an enlarged partial side view of packaged semiconductor device 10 illustrating a portion of side surface 362 of package body 36 where a distal end surface 195 of tie bar 194 is exposed through package body 36. In accordance with the present embodiment, distal end surface 195 is absent conductive material 26 because tie bars 194 are separated or singulated after conductive layer 26 is formed.

Figure 4:
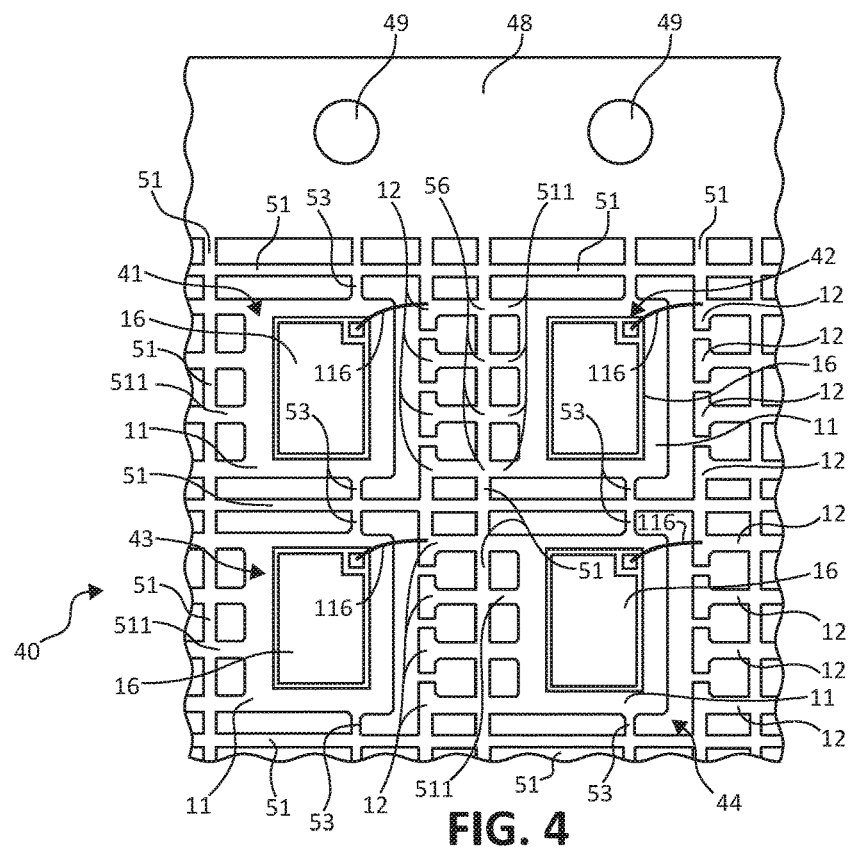
FIG. 4 illustrates a top view of a conductive frame structure having electronic die attached to die attach pads in accordance with an embodiment of the present invention.

Turning now to FIGS. 4-10, a method for forming packaged electronic devices or packaged semiconductor devices including package semiconductor device 10 will be described. FIG. 4 illustrates a top view of a conductive frame structure 40 having electronic die 16, such as a semiconductor die, attached to die attach pads 11 in accordance with a first embodiment. In an early step of manufacture, conductive frame structure 40 is provided having a plurality of sub-structures 41, 42, 43, and 44 or sub-frame structures 41, 42, 43, and 44. In one embodiment, conductive frame structure 40 can be provided as an N×M array of sub-structures including a 2×2 array as generally illustrated in FIG. 4. In some embodiments, each sub-structure can include a die attach pad 11 attached to a conductive frame 51 or frame 51, which is spaced apart and surrounds die attach pad 11. In some embodiments, each frame 51 can have a square shape and die attach pad 11 can be attached to frame 51 with one or more tie bars 53 and/or lead portions 511. Leads 12 are disposed spaced apart but proximate to die attach pads 11 and can be attached at ends distal to die attach pads 11 to frame 51, as generally illustrated in FIG. 4.

In some embodiments, conductive frame structure 40 includes a main portion 48 or a tap portion 48 disposed on one side of conductive frame structure 40, which may further include one or more holes 49. In some embodiments, leads 12 corresponding to a die attach pad 11 within a sub-structure are disposed only one side of die attach pad 11. In other embodiments, leads 12 can disposed on more than one side of die attach pad 11. As generally illustrated in FIG. 4, leads 12 of sub-structure 41 have distal ends joined to distal ends of lead portions 511 extending outward from die attach pad 11 in sub-structure 42. In some embodiments, where these distal ends are joined is referred to as joined conductive portions 56. In some embodiments, each joined conductive portion 56 includes at least a portion of frame 51 interposed between the distal ends of leads 12 and lead portions 511. It is understood that joined conductive portions 56 can also include portions adjoining leads 12 that are directly attached to a die attach pad 11 in an adjacent sub-structure, can include portions adjoining leads 12 from adjacent sub-structures, and can include combinations thereof. In general, joined conductive portions 56 are those portions of conductive frame structure 40 that will be separated, singulated, or removed in subsequent processing thereby exposing conductive flank surfaces, conductive sides surfaces, or conductive distal end surfaces of the leads, lead portions, die attach pads, or conductive portions exposed after the separation process.

In accordance with the present embodiment, frame structure 40 comprises a conductive material. In one embodiment, conductive frame structure 40 is mainly composed of copper and is approximately 100 μm through 508 μm in thickness. In other embodiments, frame structure 40 can be mainly composed of Fe—Ni (e.g., Alloy 42) or any other metal material(s) as known to those of skill in the art. Conductive frame structure 40 can be formed or manufactured using masking and etch techniques, stamping techniques, bending or forming techniques, plating techniques, deposition techniques, machining, and/or combinations thereof. As stated before, each electronic die 16, such as semiconductor die 16, can be connected to die attach pads 11 using die attach material 17, as generally illustrated in FIG. 1. In some embodiments, a pad portion of each electronic die 16 is electrically connected to a lead 12 with a conductive connective structure 116, such as a wire bond structure. It is understood that conductive connective structures 116 can be formed at a later step of fabrication, such as after conductive frame structure 60 is attached.

Figure 5:
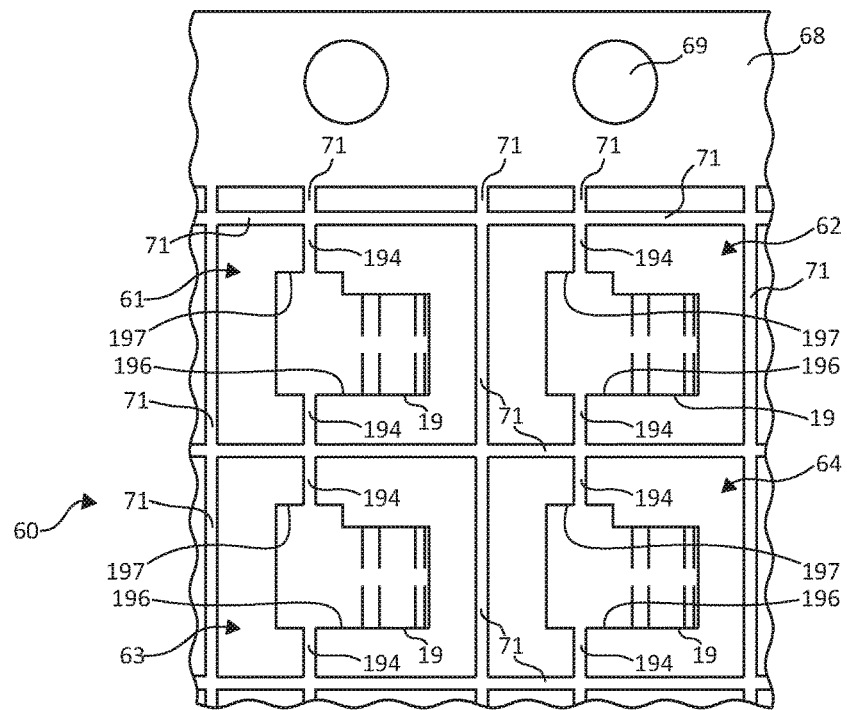
FIG. 5 illustrates a top view of a conductive frame structure having interconnected conductive connective structures in accordance with an embodiment of the present invention.

FIG. 5 illustrates a top view of a conductive frame structure 60 having interconnected conductive connective structures 19 in accordance with one embodiment, which can be provided in a step of manufacture. In accordance with the present embodiment, conductive frame structure 60 can be provided as N×M array similar to conductive frame structure 40 including a 2×2 array as generally illustrated in FIG. 5. By way of example, conductive frame structure 60 can be configured to include a plurality of sub-structures 61, 62, 63, and 64 or sub-frame structures 61, 62, 63, and 64. In accordance with the present embodiment, conductive connective structures 19 in each of sub-structures 61, 62, 63, and 64 are physically and electrically interconnected or ganged together so that the interconnected conductive connective structures 19 can be used to provide current to conductive components in conductive frame structure 40 during a subsequent electroplating process. In some embodiments, each of the conductive connective structures 19 is interconnected to a conductive frame 71 or frame 71 that is spaced apart from and surrounds each conductive connective structure 19 as generally illustrated in FIG. 5. In some embodiments, tie bars 194 are used to interconnect the conductive connective structures 19 together with frame 71. In one preferred embodiment, each conductive connective structure 19 comprises at least two tie bars 194 on opposing sides 196 and 197 respectively of conductive connective structure 19 as generally illustrated in FIG. 5. In one preferred embodiment, tie bars 194 are positioned within conductive frame structure 60 to be perpendicular to leads 12 in conductive frame structure 40. Stated another way, tie bars 194 are positioned so that when conductive frame structure 60 is attached to conductive frame 40 tie bars 194 reside on sides of each sub-assembly that are absent conductive flank surfaces that will be subsequently electroplated. This configuration prevents tie bars 194 from being prematurely singulated when joined conductive portions 56 are removed.

In some embodiments, conductive frame structure 60 includes a main portion 68 or tap portion 68 disposed on one side of conductive frame structure 60, which may further include one or more holes 69. As will be described in more detail later, main portion 68 is configured to physically contact or electrically connect to main portion 48 of conductive frame structure 40 to allow current to flow through both conductive frame structure 40 and conductive frame structure 60 including conductive interconnects structures 19 during an electroplating process.

In accordance with the present embodiment, frame structure 60 comprises a conductive material. In one embodiment, conductive frame structure 60 is mainly composed of copper and is approximately 100 μm through 508 μm in thickness. In other embodiments, frame structure 60 can be mainly composed of Fe—Ni (e.g., Alloy 42) or any other metal material(s) as known to those of skill in the art. Conductive frame structure 60 can be formed or manufactured using masking and etch techniques, stamping techniques, bending or forming techniques, plating techniques, deposition techniques, machining, and/or combinations thereof.

Figure 6:
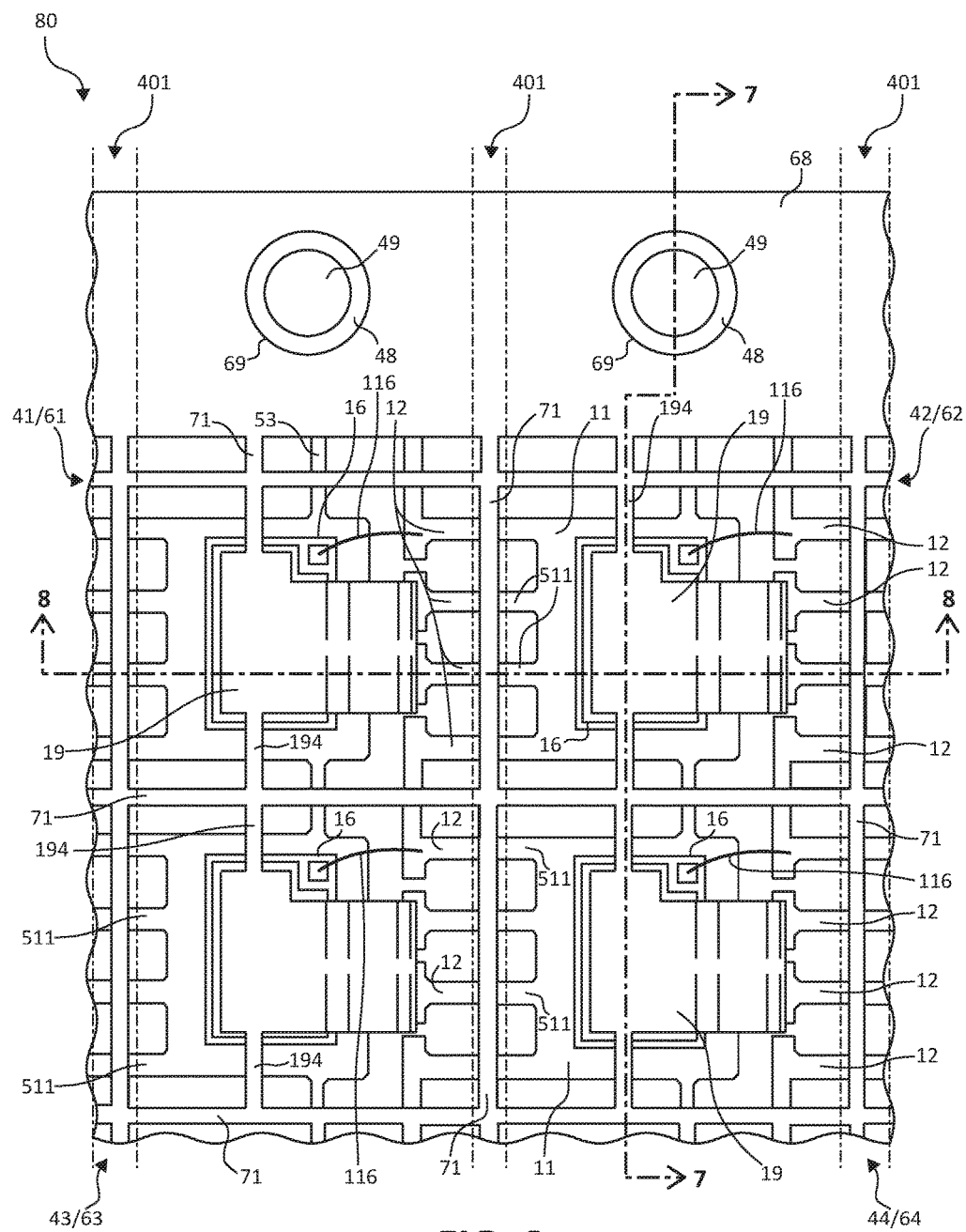
FIG. 6 illustrates a top view of the conductive frame structure of FIG. 5 disposed overlying the conductive frame structure of FIG. 4 to provide a sub-assembly in accordance with an embodiment of the present invention.

FIG. 6 illustrates a top view of conductive frame structure 60 disposed overlying conductive frame structure of 40 to provide a sub-assembly 80 in accordance with an embodiment. In one embodiment, in an additional step, conductive frame structure 60 and conductive frame 40 are connected together, including, for example, attached together by attaching conductive connective structures 19 to semiconductor die 16 and to leads 12. As described previously, conductive connective structures 19 each can be attached to semiconductor die 16 using a die attach material 18 (illustrated in FIG. 1), which can be a solder paste, a conductive epoxy, conductive adhesives, conductive films, or other suitable attach materials as known to those of skill in the art. In addition, conductive connective structures 19 each can be attached to leads 12 using an attachment layer 23 (illustrated in FIG. 1), which can be a solder paste, a conductive epoxy, conductive adhesives, conductive films, or other suitable attach materials as known to those of skill in the art. In some embodiments, an additional attachment layer 418 (illustrated in FIG. 7) can be used to attach other portions of conductive frame structure 60 to conductive frame 40 including, for example, main portion 68 to main portion 48 to physically connect these two portions together. The additional attachment layer 418 (illustrated in FIG. 7) can be materials similar to die attach material 18. At this step, a sub-assembly 80 is provided in accordance with the present embodiment. Reference is also made in FIG. 6 to portions 401 the will be subsequently removed in accordance with the present, which is further described in conjunction with FIG. 10.

FIG. 7 illustrates a cross-sectional view of the sub-assembly 80 taken along reference line 7-7 of FIG. 6, and FIG. 8 illustrates a cross-sectional view of sub-assembly 80 taken along reference line 8-8 of FIG. 6. As illustrated in FIG. 7 main portion 68 of conductive frame structure 60 has been brought into physical contact with main portion 48 of conductive frame structure 40 through, for example, attachment layer 418. In accordance with the present embodiment, this contact can be used to later connect the sub-assembly to a belt finger portion of an electroplating apparatus, which suspends the sub-assembly within a plating solution. In accordance with the present embodiment, conductive connective structures 19 are interconnected together or ganged together by tie bars 194 and frame 71 and further interconnected to main portion 68. Further, this structure facilitates the passage of current to leads 12 during the electroplating process to form conductive layer 26 on the conductive flank surfaces 121 (illustrated as dashed lines) of leads 12.

FIG. 9 illustrates a cross-sectional view of sub-assembly 80 of FIG. 8 after further processing. In one embodiment, an encapsulating step is used to form one or more encapsulating package bodies 36 covering at least portions of sub-assembly 80 to provide an encapsulated sub-assembly 90. In some embodiments, package bodies 36 can be polymer based composite material, such as epoxy resin with filler, epoxy acrylate with filler, or polymer with proper filler. Package bodies 36 comprise a non-conductive and environmentally protective material that protects semiconductor dies 16 from external elements and contaminants. Package bodies 36 may be formed using paste printing, compressive molding, transfer molding, over-molding, liquid encapsulant molding, vacuum lamination, other suitable applicator, or other processes as known to those of skill in the art.

In some embodiments, package bodies 36 are molded structures comprising is an epoxy mold compound ("EMC") and can be formed using transfer or injection molding techniques.

FIG. 10 illustrates a cross-sectional view of the encapsulated sub-assembly 90 after additional processing in accordance with the present embodiment. In accordance with the present embodiment, portions (e.g., portions 401) of encapsulated sub-assembly 90 are removed including joined conductive portions 56 from conductive frame structure 40. In one preferred embodiment, joined conductive portions 56 are removed in their entirety thereby completely exposing the end surfaces (i.e., conductive flank surfaces 121) of leads 12 and lead portions 511. In some embodiments, a partial sawing process is used to remove portions of conductive frame structure 40 including joined conductive portions 56. In some embodiments, a portion of encapsulating layer 360 is removed as well. Other processes can be used to remove portions 401 including, for example, masking and etching techniques, ablation techniques, laser techniques, and other techniques as known to those skilled in the art.

In a subsequent step, conductive layer 26 is disposed along exposed surfaces of conductive frame structure 40 including, for example, exposed portions of die attach pads 11, leads 12, and lead portions 511. In one preferred embodiment, encapsulated sub-assembly is placed into a electroplating bath or solution and current passed through conductive frame structure 40 and conductive frame structure 60 to electroplate conductive layer 26 onto the exposed surfaces of conductive frame structure 40. In accordance with the present embodiment, interconnected conductive connective structures 19 are configured to facilitate an electrical connection to leads 12 thereby electroplating conductive layer 26 onto exposed conductive flank surfaces 121 of leads 12, which provides up to approximately 100% coverage of these surfaces compared to prior processes and structure that provide less than 60% coverage. Conductive layer 26 can be a solderable material, such as tin based solder or other solderable materials as known to those of skill in the art. In one embodiment, conductive layer 26 can be a matte tin material having a thickness in range from approximately 300 to approximately 800 micro inches (approximately 7.6 microns to approximately 23.0 microns). In one embodiment, a belt finger is attached to main portions 48 and 68 of encapsulated sub-assembly 90 for placement into the electroplating bath or solution.

In some embodiments, after conductive layer 26 is formed, encapsulated sub-assembly 90 is singulated or separated along, for example, separation regions 403 to provide a plurality of packaged semiconductor devices, such as packaged semiconductor device 10. In some embodiments, a sawing process is used to singulate encapsulated sub-assembly 90, but other separation processes can be used as known to those of skill in the art.

In some embodiments, one or more of die attach pad 11, leads 12, conductive connective structure 19, and tie bars 194, frame 51, tie bars 53, lead portions 511, joined conductive portions 56, main portion 48, tie bars 194, frame 71, main portion 68, and/or portions thereof are non-limiting examples of conductive components.

In view of all of the above, it is evident that a novel method for making packaged semiconductor devices with improved coverage of conductive flank surfaces with a solderable material and structure have been disclosed. Included, among other features, are a conductive frame structure having interconnected conductive connective structures that are connected to lead structures in a second conductive frame structure. The conductive frame structure facilities electrical connection to conductive components, such as leads, thereby providing the improved solderable material coverage on the conductive flank surfaces. The method and structure provide up to 100% wettable flank coverage when the packaged semiconductor devices are attached to a next level of assembly, such as a printed circuit board. This provides stronger solder joints and improves reliability compared to previous structures and methods. The method and structure provide a cost effective solution to improving wettable flank coverage and are compatible with existing assembly method.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of forming packaged semiconductor devices, comprising:
   providing a first conductive frame structure having joined conductive portions;
   providing a second conductive frame structure comprising a plurality of interconnected conductive connective structures;
   attaching the plurality of interconnected conductive connective structures to the joined conductive portions to provide a first sub-assembly;
   encapsulating the first sub-assembly with an encapsulating layer to provide an encapsulated sub-assembly;
   removing the joined conductive portions of the first conductive frame structure to form a plurality of conductive flank surfaces disposed on side surfaces of the encapsulated sub-assembly;
   forming a conductive layer onto the conductive flank surfaces after the step of removing the joined conductive portions; and
   separating the encapsulated sub-assembly to provide the packaged semiconductor devices each having portions of the conductive flank surfaces covered by the conductive layer.

2. The method of claim 1, wherein forming the conductive layer comprises electroplating the conductive layer onto the conductive flank surfaces using the plurality of interconnected conductive connective structures to pass current through portions of the first conductive frame structure.

3. The method of claim 1 wherein:
   providing the first conductive frame structure comprises providing:
      a first die attach pad;
      a second die attach pad spaced apart from the first die attach pad;
      a first lead disposed proximate to the first die attach pad; and
      a second lead disposed proximate to the second die attach pad, wherein the first lead is adjoined to one of the second lead or the second die attach pad to provide one of the joined conductive portions;
      a first semiconductor die attached to the first die attach pad;
      a second semiconductor die attached to the second die attach pad;
   attaching the plurality of interconnected conductive connective structures comprises:
      attaching a first conductive connective structure to the first semiconductor die and the first lead; and
      attaching a second conductive connective structure to the second semiconductor die, wherein the first conductive connective structure is physically interconnected to the second conductive connective structure;
   encapsulating comprises leaving at least portions of the first conductive frame structure exposed to the outside of the encapsulated sub-assembly; and
   removing comprises removing the one of the joined conductive portions to expose a flank surface of the first lead.

4. The method of claim 3, wherein:
   attaching the first conductive connective structure comprises attaching a first clip structure;
   attaching the second conductive connective structure comprises attaching a second clip structure;
   attaching the second clip structure further comprises attaching the second clip structure to the second lead; and
   removing comprises removing the joined conductive portions in their entirety.

5. The method of claim 3, wherein providing the first conductive frame structure comprises providing the first lead physically connected to the second die attach pad such that the one joined conductive portion is interposed between the first lead and the second die attach pad.

6. The method of claim 3, wherein attaching the plurality of interconnected conductive connective structures comprises bringing a portion of the first conductive frame structure into physical contact with the second conductive frame structure.

7. The method of claim 3, wherein forming the conductive layer comprises:
   forming the conductive layer on bottom surfaces of the first die attach pad and the second die attach pad; and
   forming the conductive layer on bottom surfaces of the first lead and the second lead.

8. The method of claim 1, wherein separating comprises providing the packaged semiconductor devices each having a distal end portion of the second conductive frame structure exposed to the outside of the encapsulating layer, and wherein the distal end portion is absent the conductive layer.

9. The method of claim 1, wherein removing the joined conductive portions comprises partially sawing into the encapsulated sub-assembly to completely remove the joined conductive portions.

10. The method of claim 1, wherein:
    forming the conductive layer comprises forming a solderable material covering approximately 100% of the conductive flank surfaces.

11. A method of making packaged electronic devices comprising:
    providing a first conductive frame structure comprising:

a first sub-structure having a first conductive component;
a second sub-structure having a second conductive component, wherein the first conductive component is adjoined to the second conductive component to provide a joined conductive structure connecting the first sub-structure to the second sub-structure;
a first electronic die coupled to the first sub-structure; and
a second electronic die coupled to the second sub-structure;
providing a second conductive frame structure comprising:
a first conductive connective structure; and
a second conductive connective structure, wherein the first conductive connective structure is physically interconnected to the second conductive connective structure;
attaching the first conductive connective structure to the first electronic die and the first conductive component and attaching the second conductive connective structure to at least the second electronic die to form a first sub-assembly;
encapsulating portions of the first sub-assembly with an encapsulating layer to form an encapsulated sub-assembly, wherein at least portions of the first conductive frame structure are exposed to the outside of the encapsulated sub-assembly;
removing all of the joined conductive structure to form a first conductive component exposed side surface and a second conductive component exposed side surface;
forming a conductive layer on the exposed surfaces of the first conductive frame structure, on the first conductive component exposed side surface, and on the second conductive component exposed side surface; and
separating the encapsulated sub-assembly to provide a first packaged electronic device having the first conductive component exposed side surface covered by the conductive layer and a second packaged electronic device having the second conductive component exposed side surface covered by the conductive layer.

12. The method of claim 11, wherein forming the conductive layer comprises:
placing the encapsulated sub-assembly into a plating solution; and
passing a current through the first conductive frame structure and the second frame structure to electroplate the conductive layer on the exposed surfaces of the first conductive frame structure, on the first conductive component exposed side surface, and on the second conductive component exposed side surface.

13. The method of claim 11, wherein
providing the first conductive frame structure comprises:
providing the first conductive component comprising a lead;
providing the second conductive component comprising a die attach pad; and
providing the second conductive frame structure comprises:
providing a first clip structure ganged together to a second clip; and
providing the first clip structure physically interconnected to the second conductive frame structure on at least two sides with tie bars.

14. The method of claim 11, wherein attaching the first conductive connective structure comprises bringing a portion of the first conductive frame structure into physical contact with the second conductive frame structure.

15. The method of claim 11, wherein separating comprises providing the first packaged electronic device and the second packaged electronic device each having a distal end portion of the second conductive frame structure exposed to the outside of the encapsulating layer that is absent the conductive layer.

16. The method of claim 11, wherein removing all of the joined conductive structure comprises sawing through the joined conductive structure.

17. The method of claim 11, wherein forming the conductive layer comprises covering approximately 100% of the first conductive component exposed side surface, and covering approximately 100% of the second conductive component exposed side surface.

18. The method of claim 11, wherein forming the conductive layer comprises forming the conductive layer comprising a solderable material.

19. The method of claim 11, wherein forming the conductive layer comprises:
forming the conductive layer on a lower surface of the first conductive component; and
forming the conductive layer on a lower surface of the second conductive component.

20. A method of forming packaged semiconductor devices, comprising:
providing a first conductive frame structure having die pads and joined conductive portions, wherein the joined conductive portions comprise one or more of joined leads or leads joined to the die pads;
attaching semiconductor devices to the die pads;
providing a second conductive frame structure comprising a plurality of interconnected conductive connective structures;
attaching the plurality of interconnected conductive connective structures to the joined conductive portions and the semiconductor devices to provide a first sub-assembly;
encapsulating the first sub-assembly with an encapsulating layer to provide an encapsulated sub-assembly;
removing the joined conductive portions of the first conductive frame structure to form a plurality of conductive flank surfaces disposed on side surfaces of the encapsulated sub-assembly;
after the step of removing the joined conductive portions, using the plurality of interconnected conductive connective structures as a conductive source to form a conductive layer on the conductive flank surfaces; and
separating the encapsulated sub-assembly to provide the packaged semiconductor devices each having portions of the conductive flank surfaces covered by the conductive layer, wherein the separating includes separating the plurality of interconnected conductive connective structures.

* * * * *